(12) United States Patent
Okumura et al.

(10) Patent No.: US 6,713,161 B1
(45) Date of Patent: Mar. 30, 2004

(54) LIGHT-TRANSMITTING ELECTROMAGNETIC SHIELDING MATERIAL AND METHOD FOR MANUFACTURING THE SAME

(75) Inventors: Shuzo Okumura, Kyoto (JP); Masahiro Nishida, Kyoto (JP); Tatsuo Ishibashi, Kyoto (JP)

(73) Assignee: Nissha Printing Co., Ltd., Kyoto (JP)

( * ) Notice: Subject to any disclaimer, the term of this patent is extended or adjusted under 35 U.S.C. 154(b) by 0 days.

(21) Appl. No.: 09/763,961

(22) PCT Filed: Aug. 27, 1999

(86) PCT No.: PCT/JP99/04621

§ 371 (c)(1),
(2), (4) Date: Feb. 28, 2001

(87) PCT Pub. No.: WO00/13475

PCT Pub. Date: Mar. 9, 2000

(30) Foreign Application Priority Data

Aug. 28, 1998 (JP) .............................. 10-243574

(51) Int. Cl.[7] .................. B32B 7/14; B32B 15/00; C08K 3/22; B05D 1/36; B29D 17/00
(52) U.S. Cl. .................. 428/203; 428/209; 428/418; 428/548; 524/431; 427/418; 264/1.33; 264/1.7; 264/210.2

(58) Field of Search .................. 427/418; 428/203, 428/209, 418, 548; 524/431; 264/1.33, 1.7, 210.2

(56) References Cited

U.S. PATENT DOCUMENTS 5,324,766 A * 6/1994 Ikejiri et al. ............... 524/433

FOREIGN PATENT DOCUMENTS

| JP | 5-016281 | 1/1993 |
| JP | 5-283889 | 10/1993 |
| JP | 2717734 | 11/1997 |
| JP | 9-298384 | 11/1997 |
| JP | 10-056289 | 2/1998 |
| JP | 10-161550 | 6/1998 |

* cited by examiner

Primary Examiner—Cynthia H. Kelly
Assistant Examiner—L. Ferguson
(74) Attorney, Agent, or Firm—Wenderoth, Lind & Ponack L.L.P.

(57) ABSTRACT

A light-transmitting electromagnetic wave-shielding material includes a hydrophilic transparent resin layer laminated on a transparent substrate. An electroless plating layer is laminated on the hydrophilic transparent resin layer in a pattern, and a black pattern section is formed on the hydrophilic transparent resin layer under the electroless plating layer. Therefore, a black electroplating layer is formed to cover the electroless plating layer laminated in a pattern.

11 Claims, 8 Drawing Sheets

LIGHT-TRANSMITTING ELECTROMAGNETIC SHIELDING MATERIAL AND METHOD FOR MANUFACTURING THE SAME

TECHNICAL FIELD

The present invention relates to a light transmitting electromagnetic wave-shielding material for shielding an electromagnetic wave and through which the inside of a microwave oven, a measuring instrument, or the like or a screen of a CRT, plasma display panel, or the like can be seen, and relates to a method of manufacturing the same.

BACKGROUND ART

As disclosed in Japanese Patent No. 2,717,734, a conventional light-transmitting electromagnetic wave-shielding material includes a hydrophilic transparent resin layer 32 laminated on a transparent substrate 3 An electroless plating layer 334 is laminated on the hydrophilic transparent resin layer 32 in a pattern, and a black pattern section 36 is formed in the hydrophilic transparent resin layer 32 under the electroless plating layer (see FIG. 1). The electroless plating layer microscopically looks like a black pattern in a fine mesh or the like to an observer.. However, the aforementioned light-transmitting electromagnetic wave-shielding material has issues described below.

In particular although a bottom surface of the electroless plating layer has a black color, a top surface of the electroless plating layer maintains a metallic luster. Therefore, when the light-transmitting electromagnetic wave-shielding material is attached to the front of a display (for example, when a shielding filter is set at the front of the display and a grounding section is provided on a front surface of the filter (observer side) or a rear surface of the filter (display side) to ensure an electrical connection (grounding) between a display case and the filter), the surface having a black color faces the observer and the surface having the metallic luster faces the display. In this case, there is a disadvantage in that visibility of the display images observed by the observer are deteriorated since the light radiated from the display is reflected from the surface of the electroless plating layer having the metallic luster and illuminates the display screen again.

To remove this disadvantage (that is, to improve visibility by suppressing reflection from a metallic surface) the following methods are available:

(1) A method of roughening a surface by sand blasting or the like to form surface irregularities;

(2) A method of forming a black coating by oxidation;

(3) A method of coating an irregular film by printing or the like; and (4) A method of coating a black film by printing or the like.

However, since the hydrophilic transparent resin layer and the electroless plating layer are subjected to a physical impact or chemical change in any of the above methods (1) to (4), transparency of the hydrophilic transparent resin layer is deteriorated, and an electromagnetic wave-shielding effect is impaired due to damage to the electroless plating layer. Another issue is that reduced conductivity of the electroless plating layer makes grounding difficult.

In addition, in methods (1), (3), and (4), it is extremely difficult to roughen a side surface 39 of the electroless plating layer or coat an irregular film or the like thereon. Therefore, light reflection from the side surface 39 of the electroless plating layer cannot be suppressed, so that visibility at slant angles, in particular, cannot be improved.

In methods (3) and (4), in particular, it is difficult to coat an irregular (projections-and-depressions) film or a black film only on a portion on which the electroless plating layer exists (so-called patterning). Furthermore, in this case, a resist process or the like is required for grounding so that an irregular film is formed except for a portion of the electroless plating layer to be grounded. Consequently, productivity is decreased.

Accordingly, an object of the present invention is to provide a light-transmitting electromagnetic wave-shielding material which has favorable properties such as transparency, electromagnetic wave-shielding effect, visibility, and the like, and which is easy to be grounded, and a method of manufacturing the same.

SUMMARY OF THE INVENTION

In order to achieve the above object, the present invention has the following constitutions.

According to a first aspect of the present invention, there is provided a light-transmitting electromagnetic wave-shielding material, wherein a hydrophilic transparent resin layer is laminated on a transparent substrate. An electroless plating layer is laminated on the hydrophilic transparent resin layer in a pattern. A black pattern section is formed only in a portion of the hydrophilic transparent resin layer under the electroless plating layer, and a black electroplating layer covering the electroless plating layer is laminated.

According to a second aspect of the present invention, there is provided a light-transmitting electromagnetic wave-shielding material, wherein a hydrophilic transparent resin layer is laminated on a transparent substrate. An electroless plating layer is laminated on the hydrophilic transparent resin layer in a pattern. A black pattern section is formed only in a portion of the hydrophilic transparent resin layer under the electroless plating layer. An electroplating layer is laminated on the electroless plating layer, and a black electroplating layer covering the electroless plating layer and the electroplating layer is laminated.

According to a third aspect of the present invention, there is provided the light-transmitting electromagnetic wave-shielding material according to the first aspect, wherein the black electroplating layer covers a top surface of the electroless plating layer exposed on an opposite side of a surface on which the black pattern section is formed, as well as a side surface of the electroless plating layer.

According to a fourth aspect of the present invention, there is provided the light-transmitting electromagnetic wave-shielding material according to the second aspect, wherein the black electroplating layer covers a top surface of the electroplating layer exposed on an opposite side of a surface on which the electroless plating layer is formed, as well as respective side surfaces of the electroless plating layer and the electroplating layer.

According to a fifth aspect of the present invention, there is provided the light-transmitting electromagnetic wave-shielding material according to the first aspect, wherein the black electroplating layer covers only a top surface of the electroless plating layer exposed on an opposite side of a surface on which the black pattern section s formed.

According to a sixth aspect of the present invention, there is provided the light-transmitting electromagnetic wave-shielding material according to the second aspect, wherein the black electroplating layer covers only a top surface of the electroplating layer exposed on an opposite side of a surface on which the electroless plating layer is formed.

According to a seventh aspect of the present invention, there is provided the light-transmitting electromagnetic wave-shielding material according to any one of the first to sixth aspects, wherein the black electroplating layer is nickel, chromium, tin, rhodium, or ruthenium metal or an alloy of any of these.

According to an eighth aspect of the present invention, there is provided a method of manufacturing a light-transmitting electromagnetic wave-shielding material comprising forming a hydrophilic transparent resin layer on a transparent substrate. An electroless plating layer is formed on the hydrophilic transparent resin layer so that the hydrophilic transparent resin layer is blackened when seen from its rear side. A resist section is formed in a desired pattern on the electroless plating layer. Etching is performed to remove a non-resist section of the electroless plating layer, on which the resist section is not formed, while patterning in black the hydrophilic transparent resin layer under the electroless plating layer when seen from its rear side. The resist section on the electroless plating layer is removed from the electroless plating layer, and a black electroplating layer is formed to cover the electroless plating layer.

According to a ninth aspect of the present invention, there is provided a method of manufacturing a light-transmitting electromagnetic wave-shielding material comprising forming a hydrophilic transparent resin layer on a transparent substrate. An electroless plating layer is formed on the hydrophilic transparent resin layer so that the hydrophilic transparent resin layer is blackened when seen from its rear side. An electroplating layer is formed on the electroless plating layer a resist section is formed in a desired pattern on the electroless plating layer. Etching is performed to remove the electroless electroplating layer on a non-resist section, where the resist section is not formed, of the electroplating layer, while patterning in black the hydrophilic transparent resin layer under the electroless plating layer when seen from its rear side. The resist section on the electroless plating layer is removed from the electroless plating layer, and a black electroplating layer covering the electroplating layer and the electroless plating layer is formed.

According to a 10th aspect of the present invention, there is provided a method of manufacturing a light-transmitting electromagnetic wave-shielding material comprising forming a hydrophilic transparent resin layer on a transparent substrate. An electroless plating layer is formed on the hydrophilic transparent resin layer so that the hydrophilic transparent resin layer is blackened when seen from its rear side, and a resist section is formed in a desired pattern on the electroless plating layer. Etching is performed to remove a non-resist section the electroless plating layer, on which the resist section is not formed, while patterning in black the hydrophilic transparent resin layer under the electroless plating layer when seen from its rear side. The resist section on the electroless plating layer from the electroless plating layer, forming an electroplating layer on the electroless plating layer, and a black electroplating layer covering the electroplating layer and the electroless plating layer is formed.

According to an 11th aspect of the present invention, there is provided a method of manufacturing a light-transmitting electromagnetic wave-shielding material comprising forming a hydrophilic transparent resin layer on an entire surface of a transparent substrate. An electroless plating layer is formed on an entire surface of the hydrophilic transparent resin layer so that the hydrophilic transparent resin layer is blackened when seen from its rear side, and a resist section is formed in a desired pattern on the electroless plating layer. An electroplating layer is formed on a non-resist section of the electroless plating layer, on which the resist section is not formed, and the resist section on the electroless plating layer from the electroless plating layer. Etching is performed to remove an electroplating layer non-existent portion of the electroless plating layer while patterning in black the hydrophilic transparent resin layer under the electroless plating layer when seen from its rear side; and a black electroplating layer covering the electroplating layer and the electroless plating layer is formed.

According to a 12th aspect of the present invention, there is provided a method of manufacturing a light-transmitting electromagnetic wave-shielding material comprising forming a hydrophilic transparent resin layer on a transparent substrate. An electroless plating layer is formed on the hydrophilic transparent resin layer so that the hydrophilic transparent resin layer is blackened when seen from its rear side. A black electroplating layer is formed on the electroless plating layer, and a resist section is formed in a desired pattern on the black electroplating layer. Etching is performed to remove a non-resist section of the black electroplating layer, on which the resist section is not formed, while patterning in black the hydrophilic transparent resin layer under the electroless plating layer when seen from its rear side, and then the resist section on the black electroplating layer is removed from the black electroplating layer.

According to a 13th aspect of the present invention, there is provided a method of manufacturing a light-transmitting electromagnetic wave-shielding material comprising forming a hydrophilic transparent resin layer on a transparent substrate. An electroless plating layer is formed on the hydrophilic transparent resin layer so that the hydrophilic transparent resin layer is blackened when seen from its rear side, an electroplating layer is formed on the electroless plating layer, a black electroplating layer is formed on the electroless plating layer, and a resist section is formed in a desired pattern on the black electroplating layer. Etching is performed to remove a non-resist section of the black electroplating layer, on which the resist section is not formed, while patterning in black the hydrophilic transparent resin layer under the electroless plating layer when seen from its rear side, and then the resist section on the black electroplating layer is removed from the black electroplating layer.

According to a 14th aspect of the present invention, there is provided a method of manufacturing a light-transmitting electromagnetic wave-shielding material, wherein the black electroplating layer in any one of the eighth to 13th aspects is nickel, chromium, tin, rhodium, ruthenium metal, or an alloy of any of these.

According 15th aspect of the present invention, there is provided a light-transmitting electromagnetic wave-shielding material manufactured by the method of manufacturing the light-transmitting electromagnetic wave-shielding material according to any one of the eighth to 14th aspects.

BRIEF DESCRIPTION OF DRAWINGS

These and other aspects and features of the present invention will become clear from the following description taken in conjunction with the preferred embodiments thereof with reference to the accompanying drawings, in which.

DETAILED DESCRIPTION OF THE INVENTION

Figure 1:
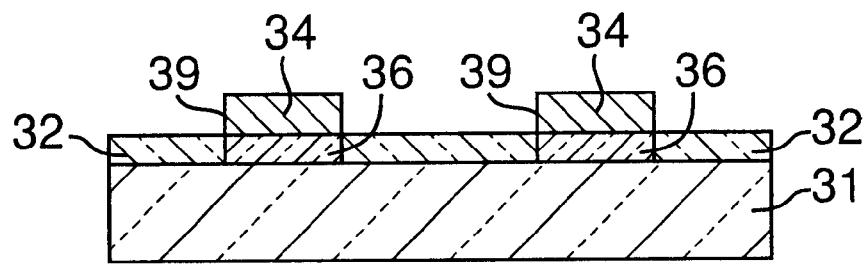
FIG. 1 is a cross sectional view showing an example of a conventional light-transmitting electromagnetic wave-shielding material.

Before the description of the present invention proceeds, it is to be noted that like parts are designated by like reference numerals throughout the accompanying drawings.

Embodiments of the present invention are described in detail with reference to the accompanying drawings.

Figure 2:
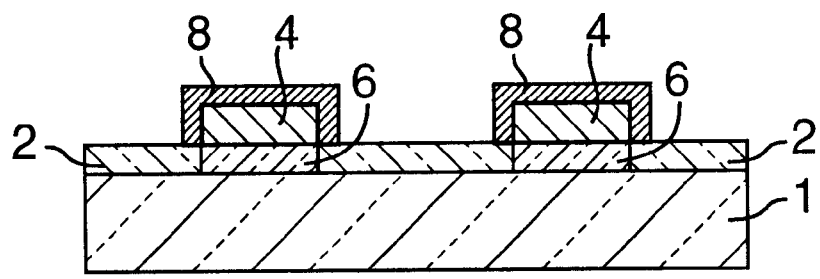
FIG. 2 is a cross sectional view showing a light transmitting electromagnetic wave-shielding material manufactured by a method of manufacturing a light-transmitting electromagnetic wave-shielding material according to a first embodiment of the present invention.
Figure 3:
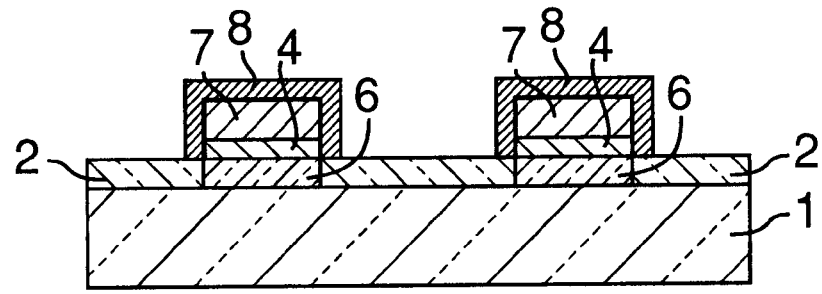
FIG. 3 is a cross sectional view showing a light-transmitting electromagnetic wave-shielding material manufactured by methods of manufacturing a light-transmitting electromagnetic wave-shielding material according to second to fourth embodiments of the present invention.

FIG. 2 is a cross sectional view showing a light-transmitting electromagnetic wave-shielding material according to a first embodiment of the present invention. FIG. 3 is a cross sectional view showing a light-transmitting electromagnetic wave-shielding material according to second to fourth embodiments of the present invention. FIGS. 4A–4F, 5A–5G, 6A–6G, and 7A–7G are cross sectional views showing respective steps of methods of manufacturing light-transmitting electromagnetic wave-shielding materials according to the first to fourth embodiments of the present invention. FIGS. 9A–9E and 10A–10F are cross sectional views showing respective steps of methods of manufacturing light-transmitting electromagnetic wave-shielding materials according to the fifth and sixth embodiments of the present invention. In the figures, reference numeral 1 denotes a transparent substrate, 2 denotes a hydrophilic transparent resin layer, 4 denotes an electroless plating layer, 5 denotes a resist section, 6 denotes a black pattern section, 7 denotes an electroplating layer, 8 denotes a black electroplating layer, and 9 denotes a side surface.

First, methods of manufacturing a light transmitting electromagnetic wave-shielding material according to the first to sixth embodiments of the present invention and light-transmitting electromagnetic wave-shielding materials manufactured by these methods are outlined below.

First, a hydrophilic transparent resin layer 2 is formed on an entire surface of a transparent substrate 1 (see FIGS. 4A, 5A, 6A, and 7A).

The transparent substrates 1 include plate-like or film-like substrates constituted by glass, acrylic resin polycarbonate resin, polyethylene resin, AS resin, vinyl acetate resin, polystyrene resin, polypropylene resin, polyester resin, cellulose acetate resin, polysulfone resin, polyethersulfone resin, polyvinyl chloride resin, or the like. The shape of the transparent substrate 1 does not necessarily need to be flat, but may be curved or the like.

Any hydrophilic transparent resin layer 2 can be used so long as it can be blackened in a later electroless plating process. A vinyl alcohol resin, acrylic resin, cellulose resin, or the like is suitable for the hydrophilic transparent resin layer 2. For example, preferable vinyl alcohol resins include ethylene-vinyl alcohol copolymer, vinyl acetate-vinyl alcohol copolymer, and the like. Preferable acrylic resins include polyhydroxyethyl acrylate, polyhydroxypropyl acrylate, polyhidroxyethyl metacrylate, polyhydroxypropyl metacrylate, polyacrylamide, or polymethylol acrylamide, a copolymer thereof, and the like. Preferable cellulose resins include nitrocellulose, acetylcellulose, acetylpropylcellulose, acetylbutylcellulose, and the like. Methods of forming a hydrophilic transparent resin layer 2 include spin coating, roll coating, die coating, dip coating, bar coating, and the like.

Subsequently, an electroless plating layer 4 is formed on an entire surface of the hydrophilic transparent resin layer 2 (see FIGS. 4B, 5B, 6B, and 7B).

The hydrophilic transparent resin layer 2 is blackened by this process. Specifically, the hydrophilic transparent resin layer is immersed in a catalytic solution for chemical plating such as a palladium catalytic solution or the like. Alternatively, a palladium compound, silver compound, or the like which is used as plating nuclei for electroless plating may be dispersed and contained in the hydrophilic transparent resin layer 2 in advance. In this case, the hydrophilic transparent resin layer 2 does not need to be immersed in a catalytic solution for chemical plating.

Subsequently, the hydrophilic transparent resin layer 2 in which electroless plating nuclei are formed is immersed in an electroless plating solution to form an electroless plating layer The hydrophilic transparent resin layer 2 is blackened by this electroless plating process. Copper or nickel is suitable for this kind of electroless plating. When copper, which is highly conductive, is used, 0.2–5 $\mu$m is suitable as the thickness of the electroless plating layer 4. If the thickness is less than 0.2 $\mu$m, an electromagnetic wave-shielding effect is impaired. If the thickness exceeds 5 $\mu$m, fine line patterning by etching becomes difficult.

Figure 5A:
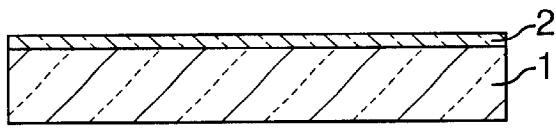
FIGS. 5A, 5B, 5C, 5D, 5E, 5F, and 5G are cross sectional views showing steps of the method of manufacturing, the light-transmitting electromagnetic wave-shielding material according to the second embodiment of the present invention.
Figure 5B:
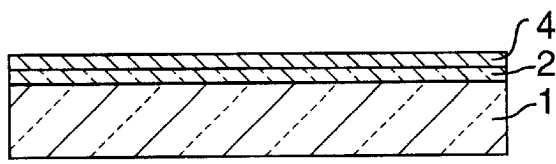
Figure 5C:
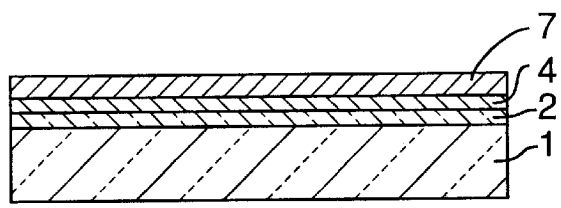
Figure 5D:
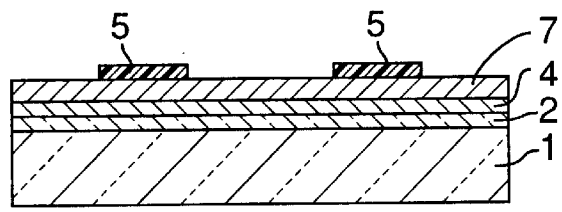
Figure 5E:
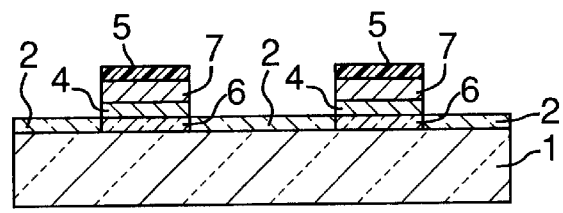

As shown in FIG. 5E, an electroplating layer 7 can be further formed on a surface of the electroless plating layer 4 to increase a speed of film formation by plating. When the electroplating layer 7 is also used, a shielding material having a high electromagnetic wave-shielding effect can be formed rapidly. When the electroplating layer 7 is also used, the film thickness of the electroless plating layer 4 may be 0.5 μm or less. In this case, the role of the electroless plating layer 4 is to form a black color on the bottom surface of the electroless plating layer and to form a base conductive layer for the electroplating layer 7.

In the methods of manufacturing light-transmitting electromagnetic wave-shielding materials according to the first to sixth embodiments of the present invention, a method of forming a second black electroplating layer 8 so as to cover the electroless plating layer 4 or both the electroless plating layer 4 and the first electroplating layer 7 is suitably employed. The reason is that when the second black electroplating layer 8 is formed on a surface with metallic luster such as the electroless plating layer 4 or the electroless plating layer 4 and the electroplating layer 7, visibility from a surface on which the black electroplating layer 8 is formed can also be improved. This surface can face an observer when used and the grounded surface can face either the observer side or the panel side. Thus, the degree of freedom in use can be increased.

Furthermore, it is optimal with respect to corrosion resistance, blackness, uniformity in a plating film, and the like when the black electroplating layer is a nickel or chromium black electroplating layer.

At least six methods of manufacturing light-transmitting electromagnetic wave-shielding materials according to the first to sixth embodiments of the present invention shown in FIGS. 4A–4F, 5A–5G, 6A–6G, 7A–7G, 9A–9E, and 10A–10F are practical, but the contents disclosed by the present invention are not limited to these methods.

As shown in FIG. 2, the light-transmitting electromagnetic wave-shielding material manufactured by the method of manufacturing the light-transmitting electromagnetic wave-shielding material according to the first embodiment is such that the hydrophilic transparent resin layer 2 is laminate on an entire surface of the transparent substrate 1, the electroless plating layer 4 is laminated on the hydrophilic transparent resin layer 2 in a pattern so that the black pattern section 6 is formed only in a portion under the electroless plating layer 4 of the hydrophilic transparent resin layer 2, and a black electroless plating layer 8 is laminated to cover a top surface and a side surface of the electroless plating layer 4.

As shown in FIG. 3, the light-transmitting electromagnetic wave-shielding material manufactured by the methods of manufacturing light-transmitting electromagnetic wave-shielding materials according to the second to fourth embodiments is constituted such that a hydrophilic transparent resin layer 2 is laminated on an entire surface of a transparent substrate 1. An electroless plating layer 4 is laminated on the hydrophilic transparent resin layer 2 in a pattern so that a black pattern section 6 is formed under the electroless plating layer 4 of the hydrophilic transparent resin layer 2. The first electroplating layer 7 is laminated on the electroless plating layer 4, and the black second electroplating layer 8 covers the electroless plating layer 4 and the electroplating layer 7.

The method of manufacturing the light-transmitting electromagnetic wave-shielding material according to each embodiment is described below with reference to drawings.

The method of manufacturing the light-transmitting electromagnetic wave-shielding material according to the first embodiment of the present invention is described with reference to steps (A) to (F) shown in FIGS. 4A–4F. FIG. 2 shows the light-transmitting electromagnetic wave-shielding material manufactured by the method of manufacturing the light-transmitting electromagnetic wave-shielding material according to the first embodiment.

Figure 4A:
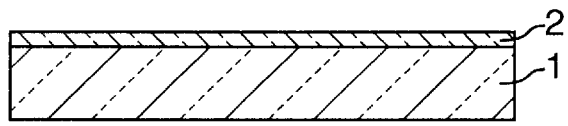
FIGS. 4A, 4B, 4C, 4D, 4E, and 4F are cross sectional views showing steps of the method of manufacturing the light-transmitting electromagnetic wave-shielding material according to the first embodiment of the present invention.

First, as shown in FIG. 4A, the hydrophilic transparent resin layer 2 is formed on an entire surface of the transparent substrate 1 (steps (A)).

Figure 4B:
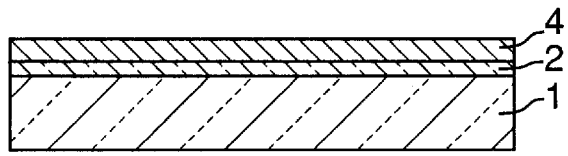

Subsequently, as shown in FIG. 4B, the electroless plating layer 4 is formed on an entire surface of the hydrophilic transparent resin layer 2 so that the hydrophilic transparent resin layer 2 is blackened when seen from the rear side (that is, the bottom side in FIG. 4B) (steps (B)).

Figure 4C:
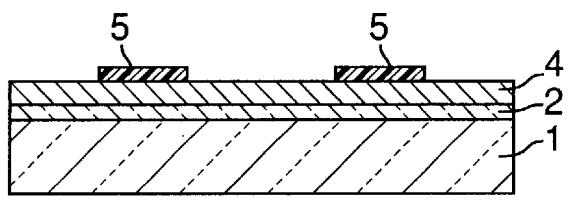

Subsequently, as shown in FIG. 4C, the resist section 5 is formed in a desired pattern on the electroless plating layer 4 (step (C)). It is preferable that the resist section 5 is not removed along with the plating layer when the plating layer is removed in a later process, and that it is a vinyl polycinnamate resin, polyisoprene resin, quinonediazide resin, or the like. The pattern of the resist section 5 is designed so that transparency and conductivity of the light-transmitting electromagnetic wave-shielding material manufactured by the method according to the first embodiment of the present invention are ensured. The resist section 5 is preferably formed on the electroless plating layer 4 by a printing or photolithography method.

Figure 4D:
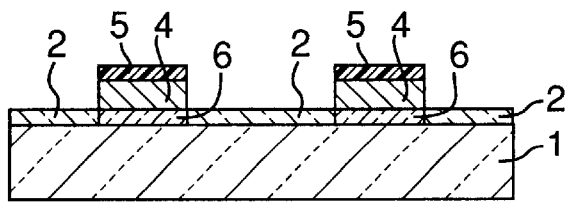
Figure 4E:
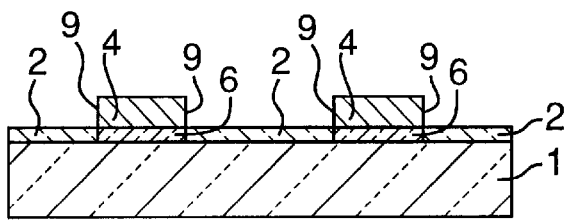
Figure 4F:
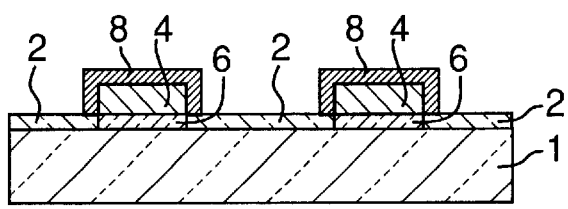

Subsequently, as shown in FIG. 4D, a non-resist section of the electroless plating layer 4, on which the resist section 5 is not formed, is removed by etching. Meanwhile, an unremoved section of the hydrophilic transparent resin layer 2 positioned below a resist-placed section of electroless plating layer 4, which is not removed because the resist section 5 is formed thereon, is patterned so that the unremoved section of the hydrophilic transparent resin layer 2 below the resist-placed section of the electroless plating layer 4 looks black when seen from its rear side (that is, the bottom side in FIG. 4D) (step (D)). As described above, since the unremoved section of the hydrophilic transparent resin layer 2 is blackened, a black pattern section 6 approximately coinciding with the patterned electroless plating layer 4 is formed thereunder as a result. Also, the portion of hydrophilic transparent resin layer 2 from which the electroless plating layer 4 is removed (that is, the portion where the black color is removed) transmits light. An etchant used for this etching is appropriately selected depending on the kind of a metal constituting the electroless plating layer 4. For example, when the metal constituting the electroless plating layer 4 is nickel, copper, or tin, it is preferable to use a ferric chloride aqueous solution as the etchant. When the metal constituting the electroless plating layer 4 is chromium, it is preferable to use a mixture solution of ceric nitrate-ammonium, perchloric acid, and water as an etchant Subsequently, as shown in FIG. 4E, the resist section 5 is removed from the electroless plating layer 4 by dissolution and removal using an alkaline aqueous solution or an organic solvent (step (E)): Then, as shown in FIG. 4F, for example, a black nickel electroplating solution shown below is used to form a black electroplating layer 8 by plating on exposed surfaces of the electroless plating layer 4 so that the exposed surfaces of the electroless plating layer 4 (that is, the top surface and the side surface) are covered by the black electroplating layer 8 (step (F)). Consequently, the light-transmitting electromagnetic wave-shielding material shown in FIG. 2 is obtained.

Since the black electroplating layer 8 is formed only on the top surface and the side surface of the electroless plating layer 4, a process of patterning the black electroplating layer 8 is not required. This is because the black electroplating layer 8 is laminated on the electroless plating layer 4, which has conductivity, by electrical action. That is, metal ions or the like in the black electroplating solution produce a black compound sulfide or the like) by reductive reaction by electron, and the black compound is deposited and laminated on the electroless plating layer 4. On the other hand, the electrical action does not occur with the hydrophilic transparent resin layer 2, which has no conductivity, and thereby no lamination occurs.

An example of the black nickel electroplating solution is shown below.

<Black Nickel Electroplating Solution>

Nickel sulfate: 100 g/l

Nickel ammonium sulfate: 30 g/l

Zinc sulfate: 15 g/l

Sodium thiocyanate: 10 g/l

A range of 30–70° C. is suitable as a plating temperature at the time of plating by the black nickel electroplating solution. Reaction is difficult at a temperature lower than 30° C. and control of the plating solution is difficult if 70° C. is exceeded. A range of 0.1–5 A/dm$^2$ is suitable as a current density at the time of this plating. A film is not easily formed if the current density is less than 0.1 A/dm$^2$, and a density exceeding 5 A/dm$^2$ is not preferable because the black electroplating layer 8 becomes fragile.

According to the first embodiment, since the black electroplating layer 8 is selectively laminated only on a portion having conductivity, that is, on the electroless plating layer 4 by electrical action, the hydrophilic transparent resin layer 2 and the electroless plating layer 4 are not subjected to physical impact or chemical change. Therefore, transparency of the hydrophilic transparent resin layer 2 is not deteriorated and there is no impairment of the electromagnetic wave-shielding effect due to damages to the electroless plating layer 4. Conductivity of the electroless plating layer 4 is not decreased and there is no difficulty in grounding.

Since the side surface of the electroless plating layer 4 can be covered by the black electroplating layer 8, light reflection from the side surface of the electroless plating layer 4 can be suppressed so that visibility at slant angles in particular can be greatly improved.

Since the electroless plating layer 4 is patterned and then the black electroplating layer 8 is formed on the entire portion where the electroless plating layer 4 is formed, the black electroplating layer 8 is easily formed and it is not necessary to form an irregular film or the like on only a portion of the electroless plating layer 4 to be grounded unlike the conventional methods (3) and (4). Therefore, productivity can be increased.

The method of manufacturing the light-transmitting electromagnetic wave-shielding material according to the second embodiment of the present invention is described with reference to steps (A) to (G) shown in FIGS. 5A–5G. FIG. 3 shows the light-transmitting electromagnetic wave-shielding material manufactured by the method of manufacturing the light-transmitting electromagnetic wave shielding material according to the second embodiment.

First, as shown in FIG. 5A, the hydrophilic transparent resin layer 2 is formed on an entire surface of the transparent substrate 1 (step (A)).

Subsequently, as shown in FIG. 5B, the electroless plating layer 4 is formed on an entire surface of the hydrophilic transparent resin layer 2 so that the hydrophilic transparent resin layer 2 is blackened when seen from the rear side (that is, the bottom side in FIG. 4B) (step (B))

Subsequently, as shown in FIG. 5C, a first electroplating layer 7 is formed on an entire surface of the electroless plating layer 4 (step (C)). In this case, the film thickness of the electroless plating layer may be 0.5 μm or less. Conductivity is mainly imparted by the electroplating layer 7.

Subsequently, as shown in FIG. 5D, the resist section 5 is formed in a desired pattern on the first electroplating layer 7 (step (D)). It is preferable that the resist section 5 is not removed along with the plating layers when the plating layers are removed in a later process, and that it is a vinyl polycinnamate resin, polyisoprene resin, quinonediazide resin, or the like. The pattern of the resist section 5 is designed so that transparency and conductivity of the light-transmitting electromagnetic wave-shielding material manufactured by the manufacturing method according to the second embodiment of the present invention are ensured. The resist section 5 is preferably formed on the first electroplating layer 7 by a printing or photolithography method.

Subsequently, as shown in FIG. 5E, a non-resist section of the first electroplating layer 7, on which the resist section 5 is not formed, and a section of the electroless plating layer 4 positioned under the non-resist section of the electroplating layer 7 are removed by etching. Meanwhile an unremoved section of the hydrophilic transparent resin layer 2 positioned below a resist-placed section of the first electroplating layer 7, which is not removed because the resist section 5 is formed thereon, and the unremoved section of the electroless plating layer 4 under this resist-placed section is patterned when seen from its rear side (that is, the bottom side in FIG. 5E) (step (E)). As described above, since the unremoved section of the hydrophilic transparent resin layer 2 is blackened, a black pattern section 6 approximately coinciding with the patterned resist-placed section of the electroplating layer 7 and the unremoved section of the electroless plating layer 4 is formed thereunder as a result. Also, the portion of the hydrophilic transparent resin layer 2 from which the electroplating layer 7 and the electroless plating layer 4 are removed (that is, the portion where the black color is removed) transmits light. An etchant used for the etching is appropriately selected depending on the kind o metals constituting the electroplating layer 7 and the electroless plating layer 4. For example, when metals constituting the electroplating layer 7 and the electroless plating layer 4 are nickel, copper, or tin, it is preferable to use a ferric chloride aqueous solution as an etchant. When metals constituting the electroplating layer 7 and the electroless plating layer 4 are chromium, it is preferable to use a mixture solution of ceric nitrate-ammonium, perchloric acid, and water as an etchant.

Figure 5F:
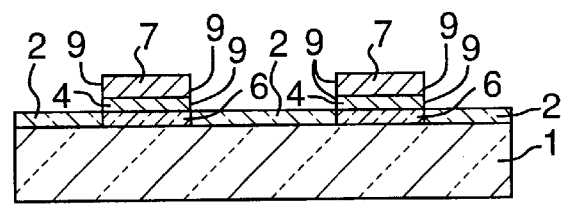
Figure 5G:
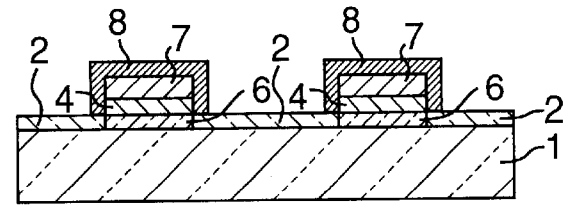

Subsequently, as shown in FIG. 5F, the resist section 5 is removed from the electroplating layer 7 by dissolution and removal using an alkaline aqueous solution or an organic solvent (step (F)). Then, as shown in FIG. 5G, for example, a black nickel electroplating solution shown below is used to form a second black electroplating layer 8 by plating on exposed surfaces of the first electroplating layer 7 and the electroless plating layer 4 so that the exposed surfaces of the first electroplating layer 7 and the electroless plating layer 4 (that is, the top surface and the side surface 9 of the electroplating layer 7 and the side surface 9 of the electroplating layer 4) are covered by the black second electroplating layer 8 (step (G)). Consequently, the top surface and the side surface 9 of the electroplating layer 7 and the side surface 9 of the electroplating layer 4 are all covered by the black second electroplating layer 8. Thus, a light-transmitting electromagnetic wave-shielding material shown in FIG. 3 is obtained.

Since the black second electroplating layer 8 is formed only on the top surface and the side surface 9 of the electroplating layer 7 and the side surface 9 of the electroless plating layer 4, a process of patterning the black electroplating layer 8 is not required. This is because the black electroplating layer 8 is laminated on the electroplating layer 7 and the electroless plating layer 4, which have conductivity, by electrical action. That is, metal ions or the like in the black electroplating solution produce a black compound (sulfide or the like) by reductive reaction by electron, and then the black compound is deposited and laminated on the electroplating layer 7 and the electroless plating layer 4. On the other hand, the electrical action does not occur with the hydrophilic transparent resin layer 2, which has no conductivity, and thereby no lamination occurs.

An example of the black nickel electroplating solution is shown below.

<Black Nickel Electroplating Solution>

Nickel sulfate: 80 g/l
Nickel ammonium sulfate: 50 g/l
Zinc sulfate: 30 g/l
Sodium thiocyanate: 20 g/l A range of 30–70° C. is suitable as a plating temperature at the time of plating by a black nickel electroplating solution. Reaction is difficult at a temperature lower than 30° C., and control of the plating solution is difficult if 70° C. is exceeded. A range of 0.1–5 $A/dm^2$ is suitable as a current density at the time of this plating. A film is not easily formed if the current density is less than 0.1 $A/dm^2$ and the density exceeding 5 $A/dm^2$ is not preferable because the black second electroplating layer 8 becomes fragile.

According to the second embodiment, since the black second electroplating layer 8 is selectively laminated only on a portion having conductivity (that is, on the electroless plating layer 4 and the electroplating layer 7) by electrical action, the hydrophilic transparent resin layer 2, the electroless plating layer 4, and the electroplating layer 7 are subjected to no physical impact or chemical change. Therefore, transparency of the hydrophilic transparent resin layer 2 is not deteriorated and there is no impairment of the electromagnetic wave-shielding effect due to damages to the electroless plating layer 4. Conductivity of the electroless plating layer 4 is not decreased and there is no difficulty in grounding.

Since the side surface of the electroless plating layer 4 can be covered by the black second electroplating layer 8, light reflection from the side surface 9 of the electroless plating layer 4 and the side surface 9 of the electroplating layer 7 can be suppressed so that visibility at slant angles in particular can be substantially improved Since the electroless plating layer 4 and the first electroplating layer 7 are patterned and then the black second electroplating layer 8 is formed on the entire portion where the electroless plating layer 4 and the first electroplating layer 7 are formed, the black second electroplating layer 8 is easily formed and it is not necessary to form an irregular film or the like only on a portion of the electroless plating layer 4 to be rounded, unlike the conventional methods (3) and (4). Therefore, productivity can be increased.

The method of manufacturing the light-transmitting electromagnetic wave-shielding material according to the third embodiment of the present invention is described with reference to steps (A) to (G) shown in FIGS. 6A–6G. FIG. 3 shows the light-transmitting electromagnetic wave-shielding material manufactured by the method of manufacturing the light-transmitting electromagnetic wave shielding material according to the third embodiment.

Figure 6A:
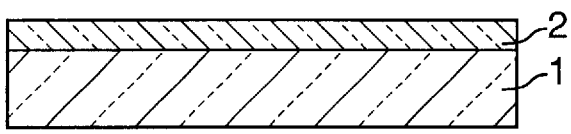
FIGS. 6A, 6B, 6C, 6D, 6E, 6F, and 6G are cross sectional views showing steps of the method of manufacturing the light-transmitting electromagnetic wave-shielding material according to the third embodiment of the present invention.

First, as shown in FIG. 6A, the hydrophilic transparent resin layer 2 is formed on an entire surface of the transparent substrate 1 (step (A)).

Figure 6B:
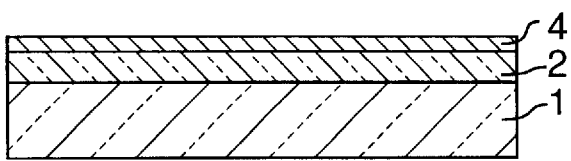

Subsequently, as shown in FIG. 6B, the electroless plating layer 4 having a film thickness of 0.5 μm or less is formed on an entire surface of the hydrophilic transparent resin layer 2 since electroplating is also employed, so that the hydrophilic transparent resin layer 2 is blackened when seen from the rear side (that is, the bottom side in FIG. 6B) (step (B)).

Figure 6C:
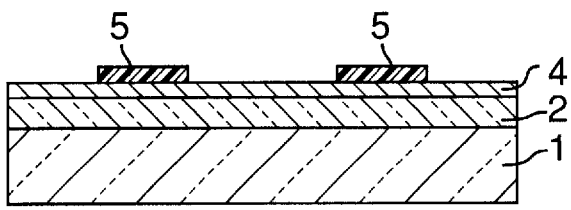

Subsequently, as shown in FIG. 6C, the resist section 5 is formed in a desired pattern on the electroless plating layer 4 (step (C)). It is preferable that the resist section 5 is not removed along with the plating layer when the plating layer is removed in a later process, and that it is a vinyl polycinnamate resin, polyisoprene resin, quinonediazide resin, or the like. The pattern of the resist section 5 is designed so that transparency and conductivity of the light-transmitting electromagnetic wave-shielding material manufactured by the manufacturing method according to the third embodiment of the present invention are ensured. The resist section 5 is preferably formed on the electroless plating layer 4 by a printing or photolithography method.

Figure 6D:
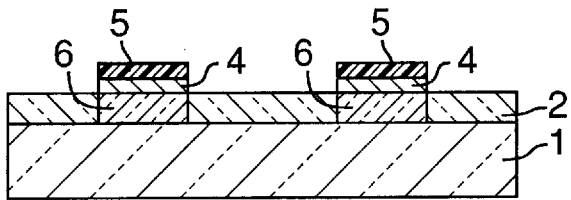

Subsequently, as shown in FIG. 6D, a non-resist section of the electroless plating layer 4, on which the resist section 5 is not formed, is removed by etching. Meanwhile, an unremoved section of the hydrophilic transparent resin layer 2 under the resist-placed section of the electroless plating layer 4, which is not removed because the resist section 5 is formed thereon, is patterned when seen from its rear side (the bottom side in FIG. 6D) (step (D)). As described above, since the unremoved section of the hydrophilic transparent resin layer 2 is blackened and patterned, the black pattern section 6 approximately coinciding with the resist-placed section of the patterned electroless plating layer 4 is formed thereunder as a result. Also, the portion of the hydrophilic transparent resin layer 2 where the electroless plating layer 4 is removed (that is, the portion where the black color is removed) transmits light. An etchant used for the etching is appropriately selected depending on the kind of metal constituting the electroless plating layer 4. For example, when the metal constituting the electroless plating layer 4 is nickel, copper, or tin, it is preferable to use a ferric chloride aqueous solution as an etchant. When the metal constituting the electroless plating layer 4 is chromium, it is preferable to use a mixture solution of ceric nitrateammonium, perchloric acid, and water as an etchant.

Figure 6E:
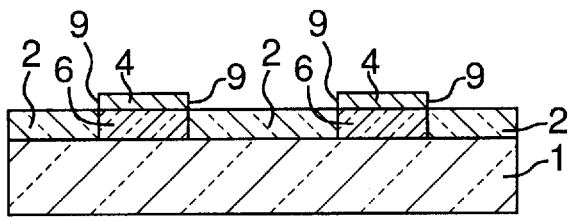
Figure 6F:
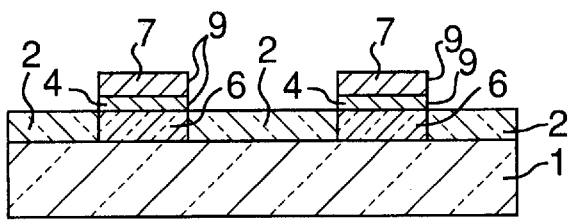

Subsequently, as shown in FIG. 6E, the resist section 5 is removed from the electroless plating layer 4 (step (E)). Then, as shown in FIG. 6F, the first electroplating layer 7 is formed on the electroless plating layer 4 patterned by dissolution and removal using an alkaline aqueous solution or an organic solvent (step (F)). In this case, fine line stepping by etching becomes easy because the film thickness of the electroless plating layer 4 is thin.

Since the first electroplating layer 7 covers only the top surface of the electroless plating layer 4, patterning of the first electroplating layer 7 is not required. This is because the first electroplating layer 7 is laminated on the electroless plating layer 4, which is conductive, by electrical action. That is, metal ions or the like in the black electroplating solution produce a black compound (sulfide or the like) by reductive reaction by electrons, and then the black compound is deposited and laminated on the electroless plating layer 4. However, the electrical action does not occur with the hydrophilic transparent resin layer 2, which has no conductivity, so that no lamination occurs.

Figure 6G:
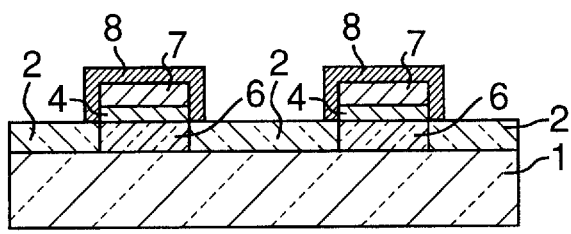

Subsequently, as shown in FIG. 6G, for example, a black chromium electroplating solution shown below is used to form the black second electroplating layer 8 by plating on exposed surfaces of the first electroplating layer 7 and the electroless plating layer 4 so that the exposed surfaces of the electroplating layer 7 and the electroless plating layer 4 (that is, the top surface and the side surface 9 of the electroplating layer 7 and the side surface 9 of the electroless plating layer 4) are covered by the black second electroplating layer 8 (step (G)). Consequently, the top surface and the side surface 9 of the first electroplating layer 7 and the side surface 9 of the electroplating layer 4 are all covered by the black second electroplating layer 8. Thus, the light-transmitting electromagnetic wave-shielding material shown in FIG. 3 is obtained.

Since the black electroplating layer 8 is formed only on the top surface and the side surface 9 of the first electroplating layer 7 and the side surface 9 of the electroless plating layer 4, a process of patterning the black second electroplating layer 8 is not required. This is because the black second electroplating layer 8 is laminated on the first electroplating layer 7 and the electroless plating layer 4, which are conductive, by electrical action, but the electrical action does not occur with the hydrophilic transparent resin layer 2, which is not conductive, and thereby no lamination occurs.

An example of the black chromium electroplating solution is shown below.
<Black Chromium Electroplating Solution>
  Chromium trioxide: 400 g/l
  Glacial acetic acid: 2 g/l
  Urea: 3 g/l
A range of 0–30° C. is suitable as a plating temperature at the time of plating by a black chromium electroplating solution. Reaction is difficult at a temperature lower than 10° C., and solution control is difficult if 30° C. is exceeded. A range of 30–70 A/dm$^2$ is suitable as a current density at the time of this plating.

According to the third embodiment, since the black second electroplating layer 8 is selectively laminated only on a portion having conductivity, that is, on the electroless plating layer 4 and the first electroplating layer 7 by electrical action, the hydrophilic transparent resin layer 2, the electroless plating layer 4, and the first electroplating layer 7 are subjected to no physical impact or chemical change. Therefore, transparency of the hydrophilic transparent resin layer 2 is not deteriorated, and there is no impairment of the electromagnetic wave-shielding effect due to damages to the electroless plating layer 4. Conductivity of the electroless plating layer 4 is not decreased and there is no difficulty in grounding.

Since the side Surface 9 of the electroless plating layer 4 can be covered by the black second electroplating layer 8, light reflection at the side surface 9 of the electroless plating layer 4 and the side surface 9 of the first electroplating layer 7 can be suppressed so that visibility at slant angles in particular can be substantially improved.

Since the electroless plating layer 4 is patterned and then the first electroplating layer 7 is formed and the black second electroplating layer 8 is formed on the entire portion where the electroless plating layer 4 and the first electroplating layer 7 are formed, the black second electroplating layer 8 is easily formed and it is not necessary to form an irregular film or the like only on a portion of the electroless plating layer 4 to be grounded, unlike the conventional methods (3) and (4). Therefore, productivity can be increased.

The method of manufacturing the light-transmitting electromagnetic wave-shielding material according to the fourth embodiment of the present invention is described below with reference to steps (A) to (G) shown in FIGS. 7A–7G. FIG. 3 shows thee light-transmitting electromagnetic wave-shielding material manufactured by the method of manufacturing the light-transmitting electromagnetic wave-shielding material according to the fourth embodiment.

Figure 7A:
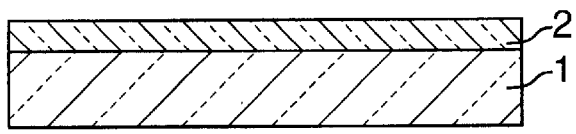
FIGS. 7A, 7B, 7C, 7D, 7E, 7F, and 7G are, cross sectional views showing steps of the method of manufacturing the light-transmitting electromagnetic wave-shielding material according to the fourth embodiment of the present invention.

First, as shown in FIG. 7A, the hydrophilic transparent resin layer 2 is formed on an entire surface o the transparent substrate 1 (step (A)).

Figure 7B:
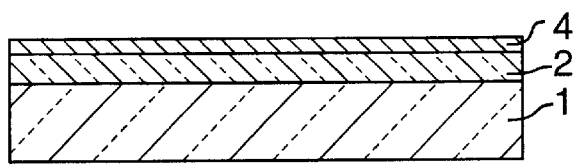

Subsequently, as shown in FIG. 7B, the electroless plating layer 4 having a film thickness of 0.5 μm or less is formed on an entire surface of the hydrophilic transparent resin layer 2 since electroplating is also employed so that the hydrophilic transparent resin layer 2 is blackened when seen from the rear side (that is, the bottom side in FIG. 7B) (step (B)).

Figure 7C:
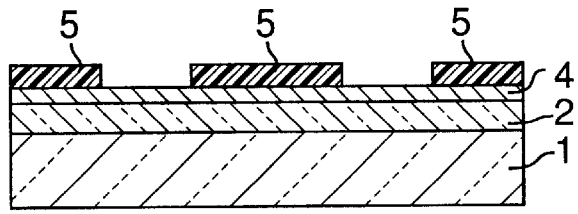

Subsequently, as shown in FIG. 7C, the resist section 5 having a negative pattern is formed in a desired pattern on the electroless plating layer 4 (step (C)). It is preferable that the resist section 5 is not removed along with the plating layer when the plating layer is removed in a later process, and that it is a vinyl polycinnamate resin, polyisoprene resin, quinonediazide resin, or the like. The pattern of the resist section 5 is designed so that transparency and conductivity of the light-transmitting electromagnetic wave-shielding material manufactured by the manufacturing method according to the fourth embodiment are ensured. The resist section 5 is preferably formed on the electroless plating layer 4 by a printing or photolithography method.

Figure 7D:
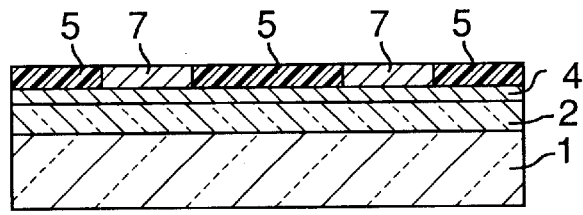
Figure 7E:
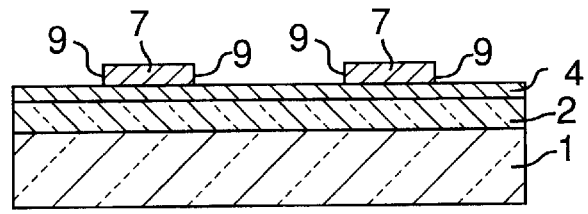
Figure 7F:
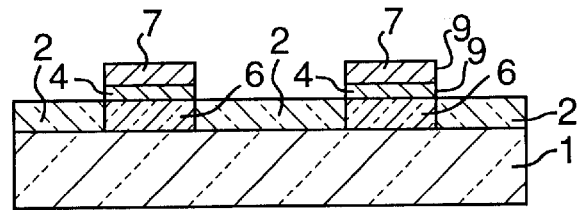

Subsequently, as shown in FIG. 7D, the first electroplating layer 7 is formed on a non-resist section of the electroless plating layer 4, on which the resist section 5 is not formed, (step (D)). In this case, the film thickness of the first electroplating layer 7 is about the same as or less than the film thickness of the resist layer 5. The reason for this is as follows. To plate according to the resist pattern (negative) of the resist layer 5, growth the plated film for forming the first electroplating layer 7 in the horizontal direction is restricted by utilizing the wall of the patterned resist layer 5. Therefore, if the plated film thickness of the first electroplating layer 7 is equal to or thicker than the resist film thickness of the resist layer 5, restriction by the resist layer 5 is disabled. Consequently, the plated film is formed in a horizontal direction (that is, entire surface plating), and patterning cannot be carried out. Since the first electroplating layer 7 is pulled when the resist layer 5 is removed, the first electroplating layer 7 is partially removed. In addition, since a part of the resist layer 5 is covered by the first electroplating layer 7, a disadvantage can arise in that the resist layer 5 is insufficiently dissolved. Subsequently, as shown in FIG. 7E, the resist section 5 is removed from the electroless plating layer 4 by dissolution and removal using an alkaline aqueous solution or an organic solvent (step (E)). Then, as shown in FIG. 7F, an electroplating layer non-existent portion of the electroless plating layer 4 is removed by etching while an unremoved section of the hydrophilic transparent resin layer 2 under the electroplating layer existent portion (that is, the unremoved section of the electroless plating layer 4) is patterned when seen from the rear side (that is, the bottom side in FIG. 7F) (step (F)). As described above, since the unremoved section of the hydrophilic transparent resin layer 2 is patterned in black, the unremoved section of the electroless plating layer 4 and the black pattern section 6 approximately coinciding with the patterned first electroplating layer 7 are formed thereunder as a result. However, since the first electroplating layer 7 is used as a resist in this case, a part of the first electroplating layer 7 is removed by etching. Therefore, the film thickness of the electroplating layer 7 needs to be 1 μm or more. The portion of the hydrophilic transparent resin layer 2 from which the black color is removed transmits light. An etchant used for the etching is appropriately selected depending on the kind of metal constituting the electroless plating layer 4. For example, when the metal constituting the electroless plating layer 4 is nickel, copper, or tin, it is preferable to use a ferric chloride aqueous solution as an etchant. When the metal constituting the electroless plating layer 4 is chromium, it is preferable to use a mixture solution of ceric nitrate-ammonium, perchloric acid, and water as an etchant.

Figure 7G:
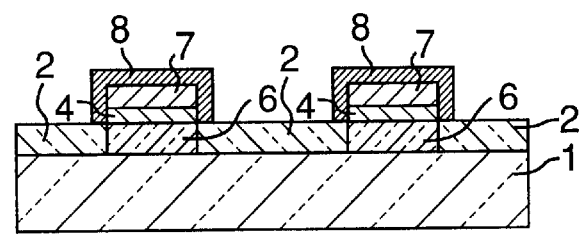

Subsequently, as shown in FIG. 7G, for example, a black chromium electroplating solution shown below is used to form the black second electroplating layer by plating on exposed surfaces of the first electroplating layer 7 and the electroless plating layer 4 so that the exposed surfaces of the first electroplating layer 7 and the electroless plating layer 4 (that is, the top surface and the side surface 9 of the electroplating layer 7 and the side surface 9 of the electroplating layer 4) are covered by the black electroplating layer 8 (step (G)). Consequently, the top surface and the side surface 9 of the first electroplating layer 7 and the side surface 9 of the electroplating layer 4 are all covered by the black second electroplating layer 8. Thus, the light-transmitting electromagnetic wave-shielding material shown in FIG. 3 is obtained.

Since the black second electroplating layer 8 is formed only on the top surface and the side surface 9 of the electroplating layer 7 and the side surface 9 of the electroless plating layer 4, patterning of the black second electroplating layer 8 is not required. This is because the black second electroplating layer 8 is laminated on the first electroplating layer 7 and the electroless plating layer 4, which are conductive, by electrical action. That is, metal ions or the like in the black electroplating solution produce a black compound (sulfide or the like) by reductive reaction by electrons, and then the black compound is deposited and laminated on the first electroplating layer 7 and the electroless plating layer 4. On the other hand, the electrical action does not occur with the hydrophilic transparent resin layer 2, which is not conductive, and thereby no lamination occurs.

An example of the black chromium electroplating solution is shown below.
<Black Chromium Electroplating Solution>
  Chromium trioxide: 400 g/l
  Glacial acetic acid: 50 g/l
  A range of 10–20° C. is suitable as a plating temperature at the time of plating by a black chromium electroplating solution. Reaction is difficult at a temperature lower than 10° C., and control of the plating solution is difficult if 20° C. is exceeded. A range of 30–100 A/dm$^2$ is suitable as a current density at the time of this plating.

To form the electroless plating layer 4 and the black portion of the hydrophilic transparent resin layer 2 thereunder in a desired pattern, methods other than etching may be employed. For example, the hydrophilic transparent resin layer 2 may be formed only on a portion of the transparent substrate 1 where a conductive section is to be formed and thereafter an electroless plating is performed.

According to the fourth embodiment, since the black electroplating layer 8 is selectively laminated only on a portion having conductivity (that is, on the electroless plating layer 4 and the first electroplating layer 7) by electrical action, the hydrophilic transparent resin layer 2, the electroless plating layer 4, and the electroplating layer 7 are subjected to no physical impact or chemical change. Therefore, transparency of the hydrophilic transparent resin layer 2 is not deteriorated and there is no impairment of the electromagnetic wave-shielding effect due to damages to the electroless plating layer 4. Conductivity of the electroless plating layer 4 is not decreased and there is no difficulty in grounding.

Since the side surface 9 of the electroless plating layer 4 can be covered by the black second electroplating layer 8, light reflection from the side surface 9 of the electroless plating layer 4 and the side surface 9 of the electroplating layer 7 can be suppressed so that visibility at slant angles in particular can be substantially improved.

Since the electroless plating layer 4 and the first electroplating layer 7 are patterned and then the black second electroplating layer 8 is formed on the entire portion where the electroless plating layer 4 and the electroplating layer 7 are formed, the black electroplating layer 8 is easily formed and it is not necessary to form an irregular film or the like only on a portion of the electroless plating layer 4 to be grounded unlike the conventional methods (3) and (4). Therefore, productivity can be increased.

The method of manufacturing the light-transmitting electromagnetic wave-shielding material according to the fifth embodiment of the present invention is described with reference to steps (A) to (E) shown in FIGS. 9A–9E.

Figure 9A:
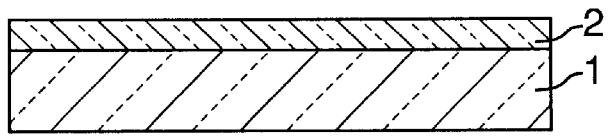
FIGS. 9A, 9B, 9C, 9D, and 9E are cross sectional views showing steps of a method of manufacturing light-transmitting electromagnetic wave-shielding material according to a fifth embodiment of the present invention.

First, as shown in FIG. 9A, the hydrophilic transparent resin layer 2 is formed on an entire surface of the transparent substrate 1 (step (A)).

Figure 9B:
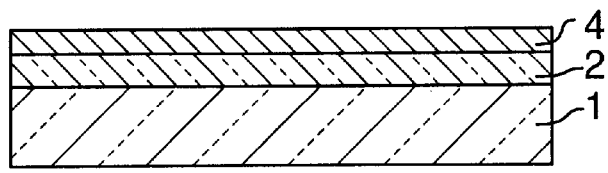

Subsequently, as shown in FIG. 9B, the electroless plating layer 4 is formed on an entire surface of the hydrophilic transparent resin layer 2 so that the hydrophilic transparent resin layer 2 is blackened when seen from the rear side (that is, the bottom side in FIG. 9B) (step (B)).

Figure 9C:
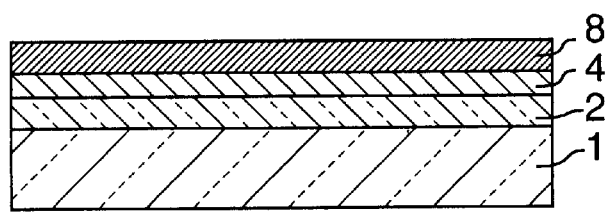

Subsequently, as shown in FIG. 9C, for example, a black nickel electroplating solution shown below is used to form the black electroplating layer 8 by plating on the entire surface of the electroless plating layer 4 (step (c)).

An example of the black nickel electroplating solution is shown below.
<Black Nickel Electroplating Solution>
  Nickel sulfate: 100 g/l
  Nickel ammonium sulfate: 30 g/l
  Zinc sulfate: 15 g/l
  Sodium thiocyanate: 10 g/l
  A range of 30–70° C. is suitable as a plating temperature at the time of plating by a black nickel electroplating solution. Reaction is difficult at a temperature lower than 30° C., and control of the plating solution is difficult if 70° C. is exceeded. A range of 0.1–5 A/dm$^2$ is suitable as a current density at the time of this plating. A film is not easily formed if the current density is less than 0.1 A/dm$^2$ and the density exceeding 5 A/dm$^2$ is not preferable since the black electroplating layer 8 becomes fragile.

Figure 9D:
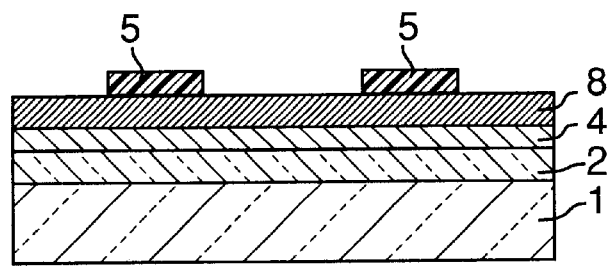

Subsequently, as shown in FIG. 9D, the resist section 5 is formed in a desired pattern on the black electroplating layer 8 (step (D)). It is preferable that the resist section 5 is not removed along with the plating layers when the plating layers are removed in a later process, and that it is a vinyl polycinnamate resin, polyisoprene resin, quinonediazide resin, or the like. The pattern of the resist section 5 is designed so that transparency and conductivity of the light-transmitting electromagnetic wave-shielding material manufactured by the manufacturing method according to the fifth embodiment of the present invention are ensured. The resist section 5 is preferably formed on the black electroplating layer 8 by a printing or photolithography method.

Figure 9E:
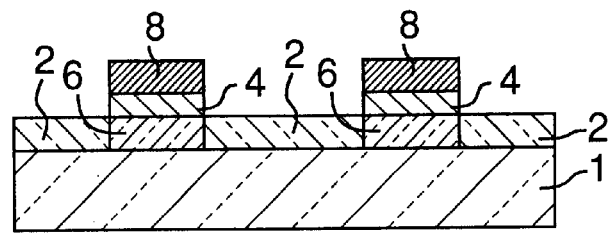

Subsequently, as shown in FIG. 9E, a non-resist section of the black electroplating layer 8, on which the resist section 5 is not formed, is removed by etching while an unremoved section of the hydrophilic transparent resin layer 2 below the resist-placed section of the black electroplating layer 8, which is not removed because the resist section 5 is formed thereon, is patterned when seen from its rear side (that is, the bottom side in FIG. 9E) (step (E)). As described above, since the unremoved section of the hydrophilic transparent resin layer 2 is blackened, the black pattern section 6 approximately coinciding with the patterned black electroplating layer 8 is formed therebelow as a result. Also, the portion of the hydrophilic transparent resin layer 2 where the black electroplating layer 8 is removed (that is, the portion where the black color is removed) transmits light. An etchant used for the etching is appropriately selected depending on the kind of a metal constituting the black electroplating layer 8. For example, when the metal constituting the black electroplating layer 8 is nickel, copper, or tin, it is preferable to use a ferric chloride aqueous solution as an etchant. When the metal constituting the black electroplating layer 8 is chromium, it is preferable to use a mixture solution of ceric nitrate-ammonium, perchloric acid, and water as an etchant.

Furthermore, as shown in FIG. 9E, the resist section 5 is removed from the black electroplating layer 8 by dissolution and removal by using an alkaline aqueous solution or an organic solvent. Consequently, the light-transmitting electromagnetic wave-shielding material shown in FIG. 9E is obtained.

According to the fifth embodiment, since the black electroplating layer 8 is selectively laminated only on a portion having conductivity (that is, on the electroless plating layer 4) by electrical action, the hydrophilic transparent resin layer 2 and the electroless plating layer 4 are subjected to no physical impact or chemical change. Therefore, transparency of the hydrophilic transparent resin layer 2 is not deteriorated, and there is no impairment of the electromagnetic wave-shielding effect due to damages to the electroless plating layer 4. Conductivity of the electroless plating layer 4 is not decreased and there is no difficulty in grounding.

Since the black electroplating layer 8 covers only the top surface of the patterned electroless plating (or electroplating) layer 4 in the above-described manufacturing method, the following effects are obtained. That is, since the black electroplating layer 8 is not existent on the side surface 9 of the electroless plating (electroplating) layer 4 in this case, the pattern line width is not widened and a decrease in transparency due to formation of the black electroplating layer 8 does not occur. In particular, in a case where there is no problem of deterioration of visibility at slant angles due to, particularly, exposure of the side surfaces of these layers since the electroless plating (electroplating) layer 4 is thin or the like, this manufacturing method can manufacture a brighter light-transmitting electromagnetic wave-shielding material.

The method of manufacturing the light-transmitting electromagnetic wave-shielding material according to the sixth embodiment of the present invention is described below with reference to steps (A) to (F) shown in FIGS. 10A–10F.

Figure 10A:
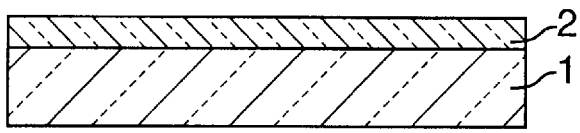
FIGS. 10A, 10B, 10C, 10D, 10E, and 10F are cross sectional views showing steps of a method of manufacturing a light-transmitting electromagnetic wave-shielding material according to a sixth embodiment of the present invention.

First, as shown in FIG. 10A, the hydrophilic transparent resin layer 2 is formed on an entire surface of the transparent substrate 1 (step (A)).

Figure 10B:
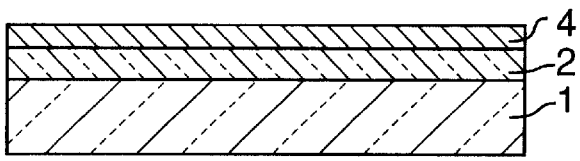

Subsequently, as shown in FIG. 10B, the electroless plating layer 4 is formed on an entire surface of the hydrophilic transparent resin layer 2 so that the hydrophilic transparent resin layer 2 is blackened when seen from the rear side (that is, the bottom side in FIG. 10B) (step (B)).

Figure 10C:
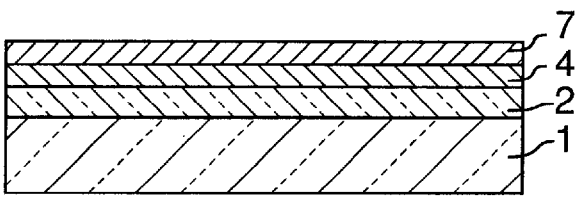

Subsequently, as shown in FIG. 10C, a first electroplating layer 7 is formed on an entire surface of the electroless plating layer 4 (step (C)).

Figure 10D:
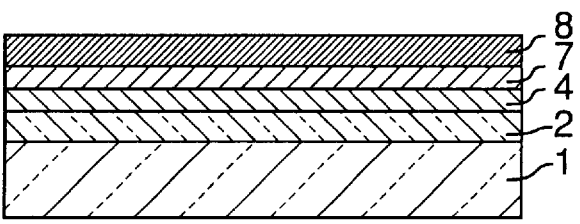

Subsequently, as shown in FIG. 10D, for example, a black nickel electroplating solution shown below is used to form a black second electroplating layer 8 by plating on an entire surface of the first electroplating layer 7 (step (D)).

An example of the black nickel electroplating solution is shown below.
<Black Nickel Electroplating Solution>
Nickel sulfate: 80 g/l
Nickel ammonium sulfate: 50 g/l
Zinc sulfate: 30 g/l
Sodium thiocyanate: 20 g/l A range of 30–70° C. is suitable as a plating temperature at the time of plating by a black nickel electroplating solution. Reaction is difficult at a temperature lower than 30° C., and control of the plating solution is difficult if 70° C. is exceeded. A range of 0.1–5 A/dm$^2$ is suitable as a current density at a time of this plating. A film is not easily formed if the current density is less than 0.1 A/dm$^2$, and the density exceeding 5 A/dm$^2$ is not preferable since the black second electroplating layer 8 becomes fragile.

Figure 10E:
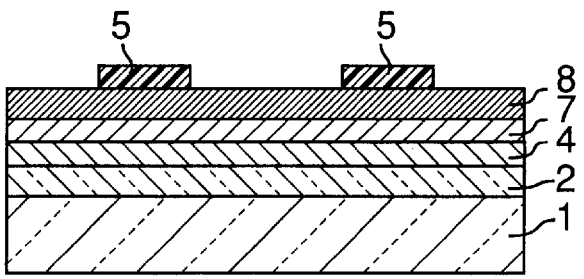

Subsequently, as shown in FIG. 10E, a resist section 5 is formed in a desired pattern on the black second electroplating layer 8 (step (E)). It is preferable that the resist section 5 is not removed along with the plating layers when the plating layers are removed in a later process, and that it is a vinyl polycinnamate resin, polyisoprene resin, quinonediazide resin, or the like. The pattern of the resist section 5 is designed so that transparency and conductivity of the light-transmitting electromagnetic wave-shielding material manufactured by the method according to the sixth embodiment of the present invention are ensured. The resist section 5 is preferably formed on the black second electroplating layer 8 by a printing or photolithography method.

Figure 10F:
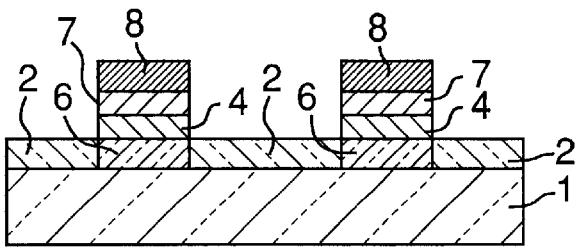

Subsequently, as shown in FIG. 10F, the non-resist section of the black second electroplating layer 8, on which the resist section 5 is not formed, a black electroplating layer non-existent section of the first electroplating layer 7 under the non-resist section of the black second electroplating layer 8, and an electroplating layer non-existent section of the electroless plating layer 4 below the black electroplating layer non-existent section are removed by etching while an unremoved section of the hydrophilic transparent resin layer 2 below the resist-placed section of the electroless plating layer 4, which is not removed because the resist section 5 is patterned when seen from its rear side (that is, the bottom side in FIG. 10F) (step (F)). As described above, since the unremoved section of the hydrophilic transparent resin layer 2 is patterned in black, the black pattern section 6 approximately coinciding with the unremoved section of the patterned electroless plating layer 4 is formed thereunder as a result. Also, the portion of the hydrophilic transparent resin layer 2 from which the removed section of the electroless plating layer 4 is removed (that is, the portion where the black color is removed) transmits light. An etchant used for the etching is appropriately selected depending on the kind of metals constituting the black second electroplating layer 8, the first electroplating layer 7, and the electroless plating layer 4. For example, when the metals constituting the black second electroplating layer 8, the first electroplating layer 7, and the electroless plating layer 4 are nickel, copper, or tin, it is preferable to use a ferric chloride aqueous solution as an etchant. When the metals constituting the black second electroplating layer 8, the first electroplating layer 7, and the electroless plating layer 4 are chromium, it is preferable to use a mixture solution of ceric nitrate-ammonium, perchloric acid, and water as an etchant.

Furthermore, as shown in FIG. 10F, the resist section 5 is removed from the black second electroplating layer 8 by dissolution and removal using an alkaline aqueous solution or an organic solvent. Consequently, a light-transmitting electromagnetic wave-shielding material shown in FIG. 10F is obtained.

According to the sixth embodiment, since the black second electroplating layer 8 is selectively laminated only on a conductive portion by electrical action, the hydrophilic transparent resin layer 2 and the electroless plating layer 4 are subjected to no physical impact or chemical change. Therefore, transparency of the hydrophilic transparent resin layer 2 is not deteriorated and there is no impairment of the electromagnetic wave-shielding effect due to damage to the electroless plating layer 4. Conductivity of the electroless plating layer 4 is not decreased and there is no difficulty in grounding.

Since the black second electroplating layer 8 covers only the top surface of the patterned electroless plating (or electroplating) layer in the above-described manufacturing method, the following effects are obtained. That is, since the black second electroplating layer 8 is not existent on the side surface 9 of the electroless plating (electroplating) layer 4 in this case, the pattern line width is not widened and a decrease in transparency due to formation of the black second electroplating layer 8 does not occur. In particular, in a case where there is no problem of deterioration of visibility at slant angles due to, particularly, exposure of the side surfaces of these layers since the electroless plating (electroplating) layer is thin or the like, this manufacturing method can manufacture a brighter light-transmitting electromagnetic wave-shielding material.

It is noted that any of the manufacturing methods according to the above first to sixth embodiments can be appropriately selected and employed as required.

In each of the above embodiments, the black electroplating layer 8 can be constituted by nickel, chromium, tin, rhodium, or ruthenium metal or an alloy of any of these More specific examples of the above first to fourth embodiments are described below.

EXAMPLE 1
(See FIGS. 4A–4F According to the First Embodiment.)

First, as shown in FIG. 4A, a methanol solution containing a polyhydroxy propylacrylate and palladium catalyst was coated on a PET film with a thickness of 100 $\mu$m and dried at 70° C. for 15 minutes (step (A)).

Subsequently, as shown in FIG. 4B, copper electroless plating was carried out at 40° C. and then water wash and drying were carried out (step (B)). Subsequently, as shown in FIG. 4C, a resist section 5 in a lattice pattern having a line width of 20 $\mu$m and a pitch of 200 $\mu$m was formed by photolithography (step (C)).

Subsequently, as shown in FIG. 4D, etching was performed by using a ferric chloride solution (step (D) ) and water wash and drying were carried out. Then, as shown in FIG. 4E, the resist was removed (step (E)).

Subsequently, as shown in FIG. 4F, a black nickel electroplating solution shown below was used to form a black electroplating layer 8 on surfaces of the electroless plating layer 4 (step (F)).
<Black Nickel Plating Solution>
Nickel sulfate: 70 g/l
Nickel ammonium sulfate: 40 g/l
Zinc sulfate: 20 g/l
Sodium thiocyanate: 15 g/l The plating temperature was 30° C. and the current density was 1 A/dm$^2$. The obtained light-transmitting electromagnetic wave-shielding material had extremely high visibility and the optical reflectance of the black electroplating layer 8 was 8%.

EXAMPLE 2
(See FIGS. 5A–5G According to the Second Embodiment.)

First, as shown in FIGS. 5A and 5B, a copper electroless plating layer 4 having a thickness of 0.5 $\mu$m was obtained by the same method as in Example 1 (steps (A) and (B)).

Subsequently, as shown in FIG. 5C, a first electroplating layer 7 having a thickness of 3 pm was formed on the electroless plating layer 4 by copper electroplating (step (C)).

Subsequently, as shown in FIG. 5D, a resist section 5 was formed as in the case of Example 1 (step (D)). As shown in FIG. 5E, etching was performed by using a ferric chloride solution (step (E)) and then, as shown in FIG. 5F, the resist section 5 was removed (step (F)).

Subsequently, as shown in FIG. 5G, a black nickel electroplating solution shown below was used to form a black second electroplating layer 8 on surfaces of the first electroplating layer 7 and the electroless plating layer 4 (step (G)).
<Black Nickel Plating Solution>
Nickel sulfate: 85 g/l
Nickel ammonium sulfate: 30 g/l
Zinc sulfate: 15 g/l
Sodium thiocyanate: 20 g/l The plating temperature was 50° C. and the current density was 0.5 A/dm$^2$. The obtained light-transmitting electromagnetic wave-shielding material had extremely high visibility and the optical reflectance of the black second electroplating layer 8 was 12%.

EXAMPLE 3
(See FIGS. 6A–6G According to the Third Embodiment.)

First, as shown in FIG. 7A, a dichloromethaneethanol mixture solvent solution containing a cellulose acetate and palladium catalyst was coated on a PET film having a thickness of 100 dun and dried at 70° C. for 20 minutes (step (A)). Subsequently, as shown in FIG. 6B, copper electroless plating was carried out at 45° C. to obtain an electroless plating layer 4 having a thickness of 0.3 pm (step (B)).

Subsequently, after water wash and drying were carried out, a resist section 5 in a lattice pattern having a line width of 15 pm and a pitch of 150 dun was formed by photolithography (step (C)) as shown in FIG. 6C.

Subsequently, as shown in FIG. 6D, etching was performed by using a ferric chloride solution (step (D)). After water wash and drying were carried out, the resist was removed (step (E)) as shown in FIG. 6E.

Subsequently, as shown in FIG. 6F, a copper first electroplating layer 7 having a thickness of 2 $\mu$m was formed on a surface of the patterned electroless plating layer 4 by electroplating (step (F)).

Subsequently, as shown in FIG. 6G, a black chromium electroplating solution shown below was used to form a black first electroplating layer 8 on surfaces of the first electroplating layer 7 and the electroless plating layer 4 (step (G)).
<Black Chromium Electroplating Solution>
Chromium trioxide: 350 g/l
Glacial acetic acid: 3 g/l
Urea: 3 g/l The plating temperature was 20° C. and the current density was 30 A/dm$^2$. The obtained light-transmitting electromagnetic wave-shielding material had extremely high visibility, and the optical reflectance of the black electroplating layer 8 was 10%.

EXAMPLE 4

(See FIGS. 7A–7G According to the Fourth Embodiment.)

First, as shown in FIG. 7A, a dichloromethaneethanol mixture solvent solution containing a cellulose acetate and palladium catalyst was coated on an acrylic film having a thickness of 300 µm and dried at 60° C. for 30 minutes (step (A)).

Subsequently, as shown in FIG. 7B, copper electroless plating was carried out at 42° C. to obtain an electroless plating layer 4 having a thickness of 0.2 µm (step (B)).

Subsequently, after water wash and drying were carried out, a resist section 5 having a thickness of 2 µm in a reciprocal lattice pattern having a line width of 25 µm and a pitch of 150 µm were formed by photolithography (step (C)) as shown in FIG. 7C Subsequently, as shown in FIG. 7D, a copper first electroplating layer 7 having a thickness of 2 µm was formed on a surface of a non-resist section of the electroless plating layer 4 by electroplating (step (D))

Subsequently, as shown in FIG. 7E, the resist section 5 was removed (step (E)). Then an electroplating layer non-existent section was etched using a ferric chloride solution, and water wash and drying were carried out (step (F)) as shown in FIG. 7F.

Subsequently, as shown in FIG. 7G, a black chromium electroplating solution shown below was used to form a black second electroplating layer 8 on surfaces of the first electroplating layer 7 and the electroless plating layer 4 (step (G))

<Black Chromium Electroplating Solution>

Chromium trioxide: 400 g/l

Glacial acetic acid: 5 g/l

Urea: 2 g/l

The plating temperature was 25° C. and the current density was 50 A/dm$^2$. The obtained light-transmitting electromagnetic wave-shielding material had extremely high visibility, and the optical reflectance of the black second electroplating layer 8 was 9%.

EXAMPLE 5

Figure 8:
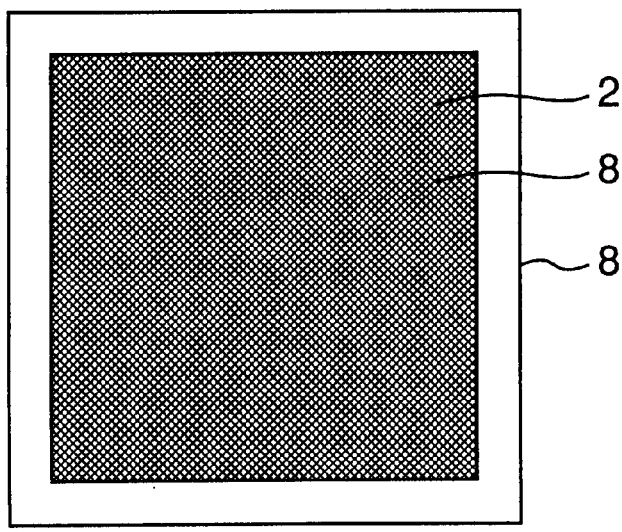
FIG. 8 is a plan view showing the light-transmitting electromagnetic wave-shielding material according to one example of the first embodiment.

(See FIGS. 2 and 8 According to the First Embodiment.)

First, a methanol solution containing a polyhydroxy propylacrylate and palladium catalyst was coated on a glass plate having a thickness of 3 mm and dried at 90° C. for 45 minutes (step (A)).

Subsequently, copper electroless plating was carried out at 40° C., and then water wash and drying were carried out (step (B)).

Subsequently, a resist section 5 in a lattice pattern having a line width of 20 dim and a pitch of 200 dun was formed by photolithography (step (C)). It is noted that a solid portion was formed in the resist section 5 on the outer frame of the glass plate so that a grounded section is provided around the lattice pattern (see FIG. 8).

Subsequently, etching was performed using a ferric chloride solution (step (D)). After water wash and drying were carried out, the resist was removed (step (E)).

Subsequently, black nickel electroplating solution shown below was used to form a black electroplating layer 8 on surfaces of the electroless plating layer (step (F): see FIGS. 2 and 8).

<Black Nickel Electroplating Solution>

Nickel sulfate: 70 g/l

Nickel ammonium sulfate: 40 g/l

Zinc sulfate: 20 g/l

Sodium thiocyanate: 15 g/l

The plating temperature was 30° C. and the current density was 1 A/dm$^2$. The obtained light-transmitting electromagnetic wave-shielding material had extremely high visibility and the optical reflectance of the black electroplating layer 8 was 8%.

EXAMPLE 6

(See FIGS. 10A–10F According to the Sixth Embodiment.)

A dichloromethane-dimethylformamide mixture solution containing a cellulose acetate and silver catalyst was coated on a PET film having a thickness of 188 pm an dried at 100° C. for 3 minutes.

Subsequently, nickel electroless plating was carried out at 55° C. to obtain an electroless plating layer having a thickness of 0.3 µm while a black color was formed in a hydrophilic transparent resin layer.

Subsequently, a copper first electroplating layer having a thickness of 2 µm was formed on an entire surface of the electroless plating layer by copper electroplating.

Subsequently, electroplating was carried out under the following conditions, and a black second plating layer was formed on an entire surface of the copper first electroplating layer.

Stannous chloride: 19 g/l

Nickel chloride: 40 g/l

Copper pyrophosphate: 3 g/l

Potassium pyrophosphate: 215 g/l

Additive agent: 5 g/l

The current density was 0.5 A/dm$^2$ and the temperature was 37° C. for 90 seconds. Subsequently, a resist section in a lattice 25 pattern having a line width of 20 dam and a pitch of 280 µm was formed on this by photolithography.

Subsequently, etching was performed on this using a ferric chloride solution. After water wash and drying were carried out, the resist was removed. The obtained light-transmitting electromagnetic wave-shielding material had extremely high visibility and the optical reflectance when seen from the black second electroplating layer side was 10%.

In the light-transmitting electromagnetic wave-shielding material and its manufacturing method of the present invention, the following effects are obtained since a black second electroplating layer is selectively laminated only on a portion having conductivity (electroless plating layer, or electroless plating layer and electroplating layer) by electrical action.

(1) Since tie hydrophilic transparent resin layer and the electroless plating layer or the hydrophilic transparent resin layer, the electroless plating layer, and the electroplating layer are subjected to no physical impact or chemical change, transparency of the hydrophilic transparent resin layer is not deteriorated and there is no impairment of the electromagnetic wave-shielding effect due to damage of the electroless plating layer. Since conductivity of the electroless plating layer is not decreased, there is no problem of difficulty in grounding.

(2) Since a black second electroplating layer can be easily laminated on the respective side surfaces of the electroless plating layer and first electroplating layer and light reflection from these side surfaces can be suppressed, visibility at slant angles in particular is improved and visibility at all visual field angles becomes favorable.

(3) Further, when the electroless plating layer or the like is patterned before the black electroplating layer is formed, patterning of the black electroplating layer is not required and a resist process for grounding is not required either. Therefore, the process of manufacturing a light-transmitting electromagnetic wave-shielding material can be simplified so that productivity is improved.

Since the black electroplating layer is formed on a surface with metallic luster, visibility of this surface with metallic luster can also be improved. Therefore, the surface with metallic luster can face an observer, and a surface to be grounded can face either the observer side or the panel side. Thus, freedom of use can be increased.

In addition, when the black electroplating layer covers only the top surface of the patterned electroless plating (or electroplating) layer, the following effects are obtained. That is, in this case, since the black electroplating layer is not existent on the side surface of the electroless plating (electroplating) layer, the pattern line width is not widened and decrease in transmittance due to formation of the black electroplating layer does not occur. In particular, when there is no problem of deterioration of visibility when observed at slant angles due to exposure of the side surfaces of these layers since the electroless plating (electroplating) layer is thin or the like, this method can be used to manufacture a brighter light-transmitting electromagnetic wave-shielding material.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A light-transmitting electromagnetic wave-shielding material, comprising:
    a transparent substrate;
    a hydrophilic transparent resin layer laminated on said transparent substrate;
    an electroless plating layer laminated on said hydrophilic transparent resin layer in a pattern so that a black pattern section is formed in only a portion of said hydrophilic transparent resin layer under said electroless plating layer;
    a first electroplating layer laminated on said electroless plating layer; and
    a black second electroplating layer, said electroless plating layer being formed on a bottom surface of said first electroplating layer, said black second electroplating layer covering only a top surface of said first electroplating layer opposite said bottom surface.

2. The light-transmitting electromagnetic wave-shielding material of claim 1, wherein said black second electroplating layer comprises one of nickel, chromium, tin, rhodium, ruthenium metal, and an alloy of any of nickel, chromium, tin, rhodium, and ruthenium metal.

3. A method of manufacturing a light-transmitting electromagnetic wave-shielding material, said method comprising:
    forming a hydrophilic transparent resin layer on a transparent substrate;
    forming an electroless plating layer on the hydrophilic transparent resin layer so that the hydrophilic transparent resin layer is blackened when viewed from a rear side of the hydrophilic transparent resin layer;
    forming a first electroplating layer on the electroless plating layer;
    forming a resist material on the first electroplating layer in a desired pattern so as to form a resist portion of the first electroplating layer located under the resist material, a resist portion of the electroless plating layer located under the resist material, a non-resist portion of the first electroplating layer not located under the resist material, and a non-resist portion of the electroless plating layer not located under the resist material;
    etching to remove the non-resist portion of the first electroplating layer and the non-resist portion of the electroless plating layer so as to pattern in black the hydrophilic transparent resin layer under the resist portion of the electroless plating layer when viewed from the rear side of the hydrophilic transparent resin layer;
    removing the resist material from the first electroplating layer; and
    forming a black second electroplating layer so as to cover the first electroplating layer and the electroless plating layer.

4. The method of claim 3, wherein the black second electroplating layer comprises one of nickel, chromium, tin, rhodium, ruthenium metal, and an alloy of any of nickel, chromium, tin, rhodium, and ruthenium metal.

5. A method of manufacturing a light-transmitting electromagnetic wave-shielding material, said method comprising:
    forming a hydrophilic transparent resin layer on a transparent substrate;
    forming an electroless plating layer on the hydrophilic transparent resin layer so that the hydrophilic transparent resin layer is blackened when viewed from a rear side of the hydrophilic transparent resin layer;
    forming a resist material on the electroless plating layer in a desired pattern so as to form a resist portion of the electroless plating layer located under the resist material and a non-resist portion of the electroless plating layer not located under the resist material;
    etching to remove the non-resist portion of the electroless plating layer so as to pattern in black the hydrophilic transparent resin layer under the resist portion of the electroless plating layer when viewed from the rear side of the hydrophilic transparent resin layer;
    removing the resist material from the electroless plating layer;
    forming a first electroplating layer on the electroless plating layer; and
    forming a black second electroplating layer so as to cover the first electroplating layer and the electroless plating layer.

6. The method of claim 5, wherein the black second electroplating layer comprises one of nickel, chromium, tin, rhodium, ruthenium metal, and an alloy of any of nickel, chromium, tin, rhodium, and ruthenium metal.

7. A method of manufacturing a light-transmitting electromagnetic wave-shielding material, said method comprising:
    forming a hydrophilic transparent resin layer on an entirety of a surface of a transparent substrate;
    forming an electroless plating layer on an entire surface of the hydrophilic transparent resin layer so that the hydrophilic transparent resin layer is blackened when viewed from a rear side of the hydrophilic transparent resin layer;
    forming a resist material on the electroless plating layer in a desired pattern so as to form a resist portion of the electroless plating layer located under the resist material and a non-resist portion of the electroless plating layer not located under the resist material;

forming a first electroplating layer on the non-resist portion of the electroless plating layer;

removing the resist material from the electroless plating layer so as to expose the resist portion of the electroless plating layer not located under the first electroplating layer;

etching to remove the resist portion of the electroless plating layer so as to pattern in black the hydrophilic transparent resin layer under the non-resist portion of the electroless plating layer when viewed from the rear side of the hydrophilic transparent resin layer; and forming a black second electroplating layer so as to cover the first electroplating layer and the electroless plating layer.

8. The method of claim 7, wherein the black second electroplating layer comprises one of nickel, chromium, tin, rhodium, ruthenium metal, and an alloy of any of nickel, chromium, tin, rhodium, and ruthenium metal.

9. A method of manufacturing a light-transmitting electromagnetic wave-shielding material, said method comprising:

forming a hydrophilic transparent resin layer on a transparent substrate;

forming an electroless plating layer on the hydrophilic transparent resin layer so that the hydrophilic transparent resin layer is blackened when viewed from a rear side of the hydrophilic transparent resin layer;

forming a first electroplating layer on the electroless plating layer;

forming a black second electroplating layer on the first electroplating layer;

forming a resist material on the black second electroplating layer in a desired pattern so as to form a resist portion of the black second electroplating layer located under the resist material, a resist portion of the first electroplating layer located under the resist material, a resist portion of the electroless plating layer located under the resist material, a non-resist portion of the black second electroplating layer not located under the resist material, a non-resist portion of the first electroplating layer not located under the resist material, and a non-resist portion of the electroless plating layer not located under the resist material;

etching to remove the non-resist portion of the black second electroplating layer so as to pattern in black the hydrophilic transparent resin layer under the resist portion of the electroless plating layer when viewed from the rear side of the hydrophilic transparent resin layer; and removing the resist material from the black second electroplating layer.

10. The method of claim 9, wherein said etching further comprises removing the non-resist portion of the first electroplating layer and the non-resist portion of the electroless plating layer.

11. The method of claim 9, wherein the black second electroplating layer comprises one of nickel, chromium, tin, rhodium, ruthenium metal, and an alloy of any of nickel, chromium, tin, rhodium, and ruthenium metal.

* * * * *